United States Patent
Shyu

(10) Patent No.: US 6,175,951 B1
(45) Date of Patent: Jan. 16, 2001

(54) METHOD FOR FABRICATING A CUSTOMER-CONFIGURED INTEGRATED CIRCUIT AND CUSTOMER-CONFIGURED INTEGRATED CIRCUIT FOR EXCLUSIVE USE BY A CUSTOMER BACKGROUND OF THE INVENTION

(75) Inventor: Rong-Fuh Shyu, Hsinchu (TW)

(73) Assignee: Winbond Electronics Corp., Hsinchu (TW)

( * ) Notice: Under 35 U.S.C. 154(b), the term of this patent shall be extended for 0 days.

(21) Appl. No.: 09/047,976

(22) Filed: Mar. 25, 1998

(51) Int. Cl.[7] .............................. G06F 17/50; G06F 12/00; G06F 13/00
(52) U.S. Cl. ............................................. 716/17; 711/163
(58) Field of Search .................................. 326/37, 38, 39; 365/185.33, 185.04; 711/1, 100, 163, 164; 716/1, 3, 17, 15, 16

(56) References Cited

U.S. PATENT DOCUMENTS

| | | | |
|---|---|---|---|
| 4,268,911 | * 5/1981 | Bell | 365/104 |
| 5,023,843 | 6/1991 | Love | 365/222 |
| 5,161,124 | 11/1992 | Love | 361/222 |
| 5,303,180 | * 4/1994 | McAdams | 365/63 |
| 5,340,767 | * 8/1994 | Flaherty | 437/54 |
| 5,353,250 | * 10/1994 | McAdams | 365/189.03 |
| 5,406,519 | * 4/1995 | Ha | 365/195 |
| 5,432,465 | 7/1995 | Jung et al. | 326/38 |
| 5,589,783 | * 12/1996 | McClure | 326/71 |
| 5,727,231 | * 3/1998 | Bartley et al. | 395/858 |
| 5,802,541 | * 9/1998 | Reed | 711/1 |
| 5,831,925 | * 11/1998 | Brown et al. | 365/230.03 |
| 5,880,596 | * 3/1999 | White | 326/38 |
| 6,034,539 | * 3/2000 | Hwang | 326/38 |

* cited by examiner

Primary Examiner—Paul R. Lintz
Assistant Examiner—Leigh Marie Garbowski
(74) Attorney, Agent, or Firm—Christensen O'Connor Johnson Kindness, PLLC

(57) ABSTRACT

An integrated circuit has an integrated circuit core formed with an application core circuit portion, a code generating circuit portion for generating a customer-specific code assigned to the integrated circuit, a proprietary code provider portion adapted to be set by the customer for providing a proprietary code, and a matching circuit portion having inputs connected to the code generating circuit portion and the proprietary code provider portion to receive the customer-specific code and the proprietary code therefrom, and an output connected to the application core circuit portion. The matching circuit portion asserts the application core circuit portion upon detection of a match between the customer-specific code and the proprietary code. A plurality of application bonding pads and code setting bonding pads are provided on the integrated circuit core. The application bonding pads are connected to the application core circuit portion and the proprietary code provider portion. The code setting bonding pads are connected to the code generating circuit portion, and are programmed by selectively connecting each of the code setting bonding pads to a reference potential to enable the code generating circuit portion to generate the customer-specific code assigned to the integrated circuit.

20 Claims, 4 Drawing Sheets

METHOD FOR FABRICATING A CUSTOMER-CONFIGURED INTEGRATED CIRCUIT AND CUSTOMER-CONFIGURED INTEGRATED CIRCUIT FOR EXCLUSIVE USE BY A CUSTOMER BACKGROUND OF THE INVENTION

BACKGROUND OF THE INVENTION

1. Field of the Invention

The invention relates to the design of integrated circuits, more particularly to a method for fabricating a customer-configured integrated circuit, and to a customer-configured integrated circuit for exclusive use by a customer.

2. Description of the Related Art

It is not unusual for integrated circuit vendors and manufacturers to provide the same functional type of integrated circuit to competing customers. In order to guard against piracy among competing customers, integrated circuit vendors and manufacturers need to develop customer-configured integrated circuits. In this way, customers can use the customer-configured integrated circuits that function in the same manner but have different configurations in the development of their own application systems. Therefore, unscrupulous customers can be prevented from copying the designs of others, and from producing and selling copied designs that use the customer-configured integrated circuits.

Conventionally, there are three methods available for programming an integrated circuit. First, a hard-wired programming scheme, such as a fixed functional setting in the functional design stage, is available to specify a particular function or configuration. However, this scheme suffers from lack of flexibility, and integrated circuit vendors and manufacturers incur a tremendous increase in production management costs because different mask layers are required, and because different raw products are produced when fabricating different customer-configured integrated circuits. Second, a software programming scheme is available in which a system driving software can change the programming of the integrated circuit anytime during the operation of the application system. While this scheme offers flexibility, it cannot provide sole protection and proprietary use for integrated circuits of the same functional type. Third, a non-volatile programming scheme is available in which a non-volatile memory, such as a flash memory, is programmed by the user. Information in the non-volatile memory does not get lost when the application system is turned on or off. Since the configuration of the integrated circuits shipped to all customers is fixed, sole-protection or proprietary use is weak because the programmed information can be easily stolen.

Customers need customer-configured integrated circuits for exclusive use so as to protect themselves from piracy. On the other hand, integrated circuit vendors and manufacturers require a simple production process to supply different customer-configured integrated circuits of the same functional type to different customers so as to incur little overhead. As such, the conventional integrated circuit programming schemes are inadequate for both the customers and the integrated circuit vendors or manufacturers.

SUMMARY OF THE INVENTION

Therefore, the main object of the present invention is to provide a method for fabricating a customer-configured integrated circuit in which, except for the bonding step, all other process steps remain unaltered for different customer-configured integrated circuits of the same functional type to result in almost unaltered production management.

Another object of the present invention is to provide a customer-configured integrated circuit that uses bonding programming to provide the same with an exclusive use function.

According to a first aspect of the invention, there is provided a method for fabricating a customer-configured integrated circuit for exclusive use by a customer. The method comprises: forming an integrated circuit core during a chip fabrication stage, the integrated circuit core having an application core circuit portion during a pad bonding stage, a code generating circuit portion for generating a customer-specific code assigned to the integrated circuit, a proprietary code provider portion adapted to be set by the customer for providing a proprietary code, and a matching circuit portion having inputs connected to the code generating circuit portion and S the proprietary code provider portion to receive the customer-specific code and the proprietary code therefrom, and an output connected to the application core circuit portion for asserting the application core circuit portion upon detection of a match between the customer-specific code and the proprietary code; providing a plurality of application bonding pads and code setting bonding pads on the integrated circuit core, the application bonding pads being connected to the application core circuit portion and the proprietary code provider portion, the code setting bonding pads being connected to the code generating circuit portion during the pad bonding stage; and programming the code setting bonding pads during the pad bonding stage by selectively bonding each of the code setting bonding pads to a reference potential to enable the code generating circuit portion to generate the customer-specific code assigned to the integrated circuit.

According to a second aspect of the invention, a customer-configured integrated circuit for exclusive use by a customer comprises an integrated circuit core and a plurality of application bonding pads and code setting bonding pads provided on the integrated circuit core.

The integrated circuit core is formed during a chip fabrication stage, the integrated circuit core having an application core circuit portion during a pad bonding stage, a code generating circuit portion for generating a customer-specific code assigned to the integrated circuit, a proprietary code provider portion adapted to be set by the customer for providing a proprietary code, and a matching circuit portion having inputs connected to the code generating circuit portion and the proprietary code provider portion to receive the customer-specific code and the proprietary code therefrom, and an output connected to the application core circuit portion. The matching circuit portion asserts the application core circuit portion upon detection of a match between the customer-specific code and the proprietary code.

The application bonding pads are connected to the application core circuit portion and the proprietary code provider portion. The code setting bonding pads are connected to the code generating circuit portion during the pad bonding stage, and are programmed during the pad bonding stage by selectively bonding each of the code setting bonding pads to a reference potential to enable the code generating circuit portion to generate the customer-specific code assigned to the integrated circuit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
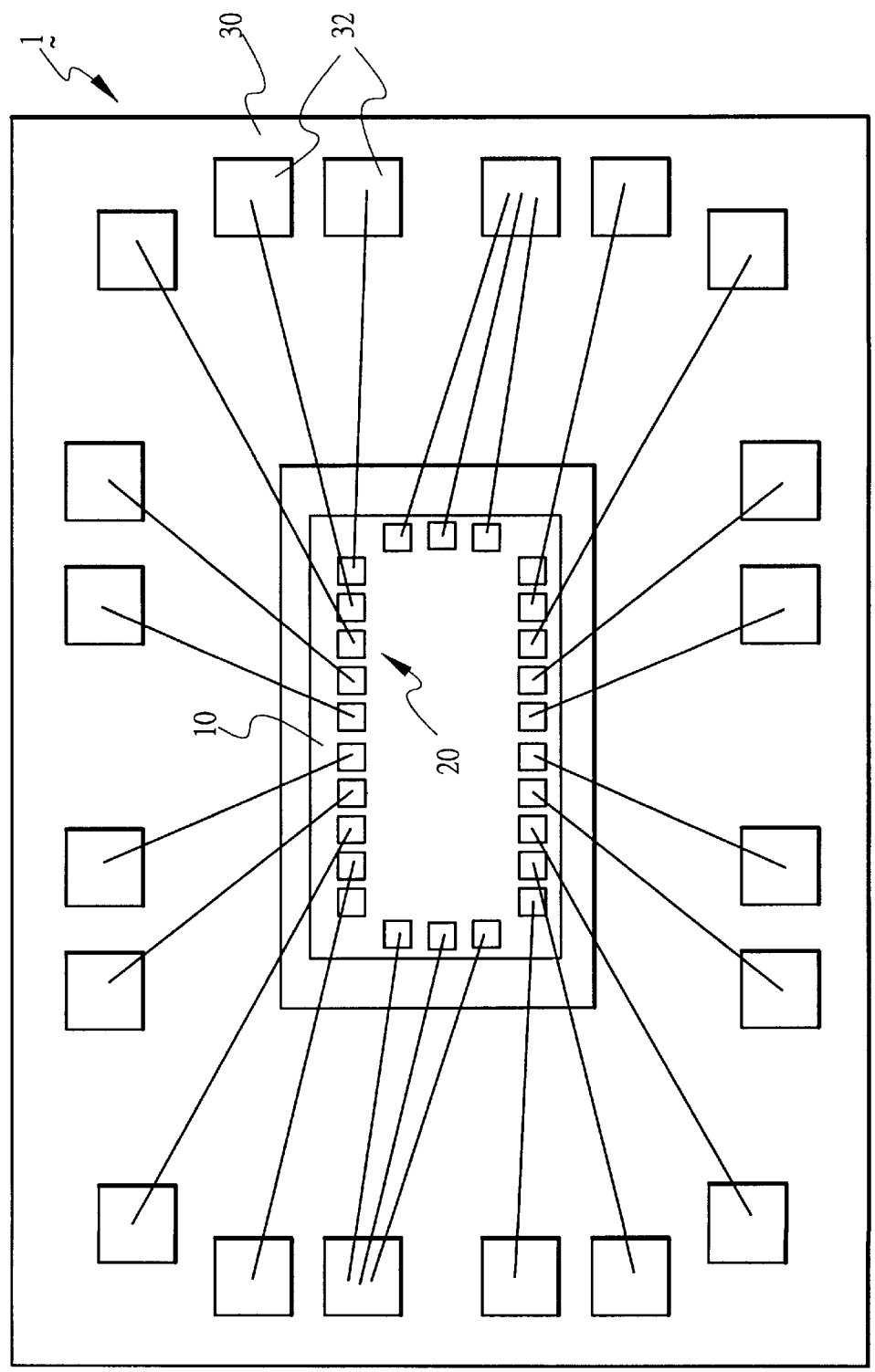
FIG. 1 is a schematic diagram illustrating a preferred embodiment of a customer-configured integrated circuit according to the present invention.

Referring to FIG. 1, the preferred embodiment of a customer-configured integrated circuit 1 according to the present invention is shown to comprise an integrated circuit core 10, bonding pads 20 provided on the integrated circuit core 10, and a lead frame 30 with lead pads 32 provided thereon. The integrated circuit core 10 is mounted on the lead frame 30, and the bonding pads 20 are wire-bonded to the lead pads 32 on the lead frame 30.

Figure 2:
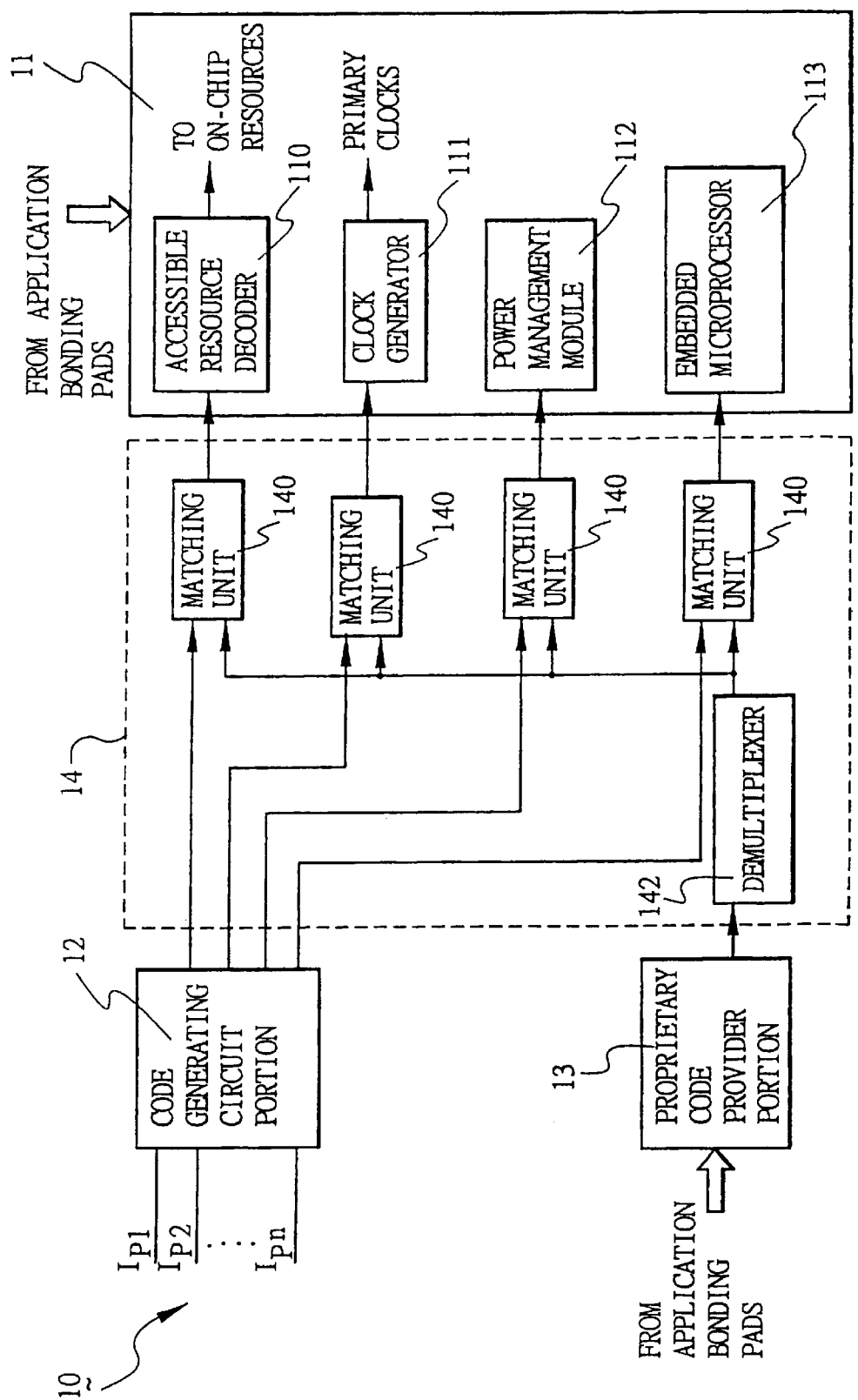
FIG. 2 is a functional block diagram of an integrated circuit core of the preferred embodiment of this invention.

As shown in FIG. 2, the integrated circuit core 10 is formed with an application core circuit portion 11, a code generating circuit portion 12, a proprietary code provider portion 13, and a matching circuit portion 14.

In the present embodiment, the application core circuit portion 11 is a known image processing application circuit that includes an accessible resource decoder 110, a clock generator 111, a power management module 112 and an embedded microprocessor 113. The accessible resource decoder 110 is operable to decode all on-chip accessible resources from input resource select signals when asserted. The clock generator 111 is operable to generate primary clocks of the application core circuit portion 11 when asserted. The power management module 112 is operable to supply power properly to the application core circuit portion 11 when asserted. The embedded microprocessor 113 is operable to properly execute its micro-program when asserted.

It should be noted that the choice of an image processing application circuit as the application core circuit portion is provided for exemplary purposes only and is not to be construed as limiting the invention to such. The application core circuit portion can differ according to the intended application of the integrated circuit.

The bonding pads 20 include a set of code setting bonding pads Ip1–Ipn, and a set of application bonding pads, such as VDD and VSS pads, signal input pads and signal output pads, connected to the application core circuit portion 11 and the proprietary code provider portion 13.

The code generating circuit portion 12 has plural inputs connected to the code setting bonding pads Ip1–Ipn, and generates a customer-specific code that is assigned to the integrated circuit 1. In this embodiment, the code generating circuit portion 12 generates a particular combination of preset code sequences in accordance with the configuration of the code setting bonding pads Ip1–Ipn of the bonding pads 20 on the integrated circuit core 10 (see FIG. 1). The preset code sequences are to be used during a certification process for the accessible resource decoder 110, the clock generator 111, the power management module 112 and the embedded microprocessor 113 of the application core circuit portion 11.

"n" code setting bonding pads can provide n power of 2 combinations to support the same number of customers. For example, when n is equal to 8, 256 different configurations, and hence 256 different customers, can be supported.

Figure 3:
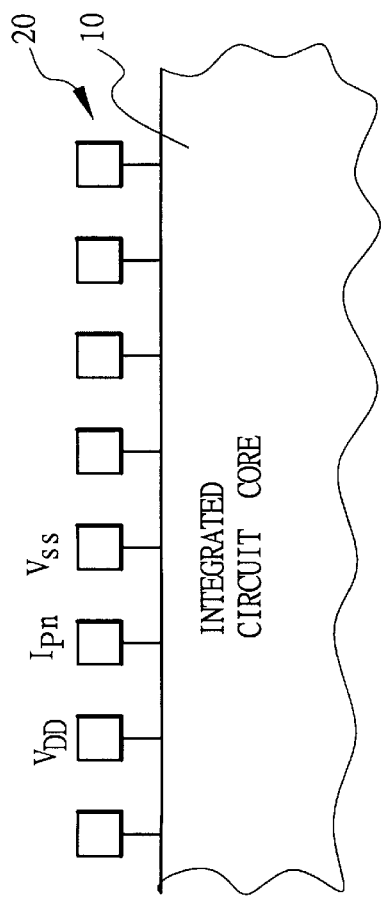
FIG. 3 illustrates a preferred arrangement of bonding pads on the integrated circuit core of the preferred embodiment of this invention.

The code setting bonding pads Ip1–Ipn are programmed by selectively bonding each of the code setting bonding pads Ip1–Ipn to a reference potential depending upon the specific configuration of a bonding requirement assigned to a specific customer, thereby enabling the code generating circuit portion 12 to generate the customer-specific code that is assigned to the integrated circuit 1. Referring to FIG. 3, to program the code setting bonding pads Ip1–Ipn, each of the code setting bonding pads Ip1–Ipn is formed between an adjacent pair of a high potential bonding pad, such as the VDD pad, and a low potential bonding pad, such as the VSS pad (only the code setting bonding pad Ipn is shown in FIG. 3 for the sake of brevity). Thereafter, each of the code setting bonding pads Ip1–Ipn can be programmed to a high logic state by connecting the same to the adjacent high potential pad or to a low logic state by connecting the same to the adjacent low potential pad. Connection of the code setting bonding pads Ip1–Ipn to the appropriate one of the high potential and low potential bonding pads in the adjacent pair is achieved via wire bonding to a common one of the lead pads 32 on the lead frame 30 during the bonding stage of the manufacturing process of the integrated circuit 1, as shown in FIG. 1.

Figure 4:
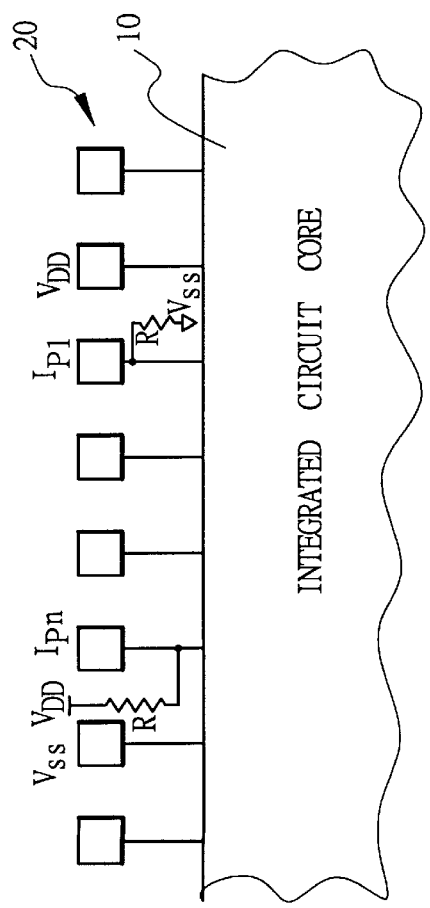
FIG. 4 illustrates another preferred arrangement of bonding pads on the integrated circuit core of the preferred embodiment of this invention.

FIG. 4 illustrates an alternative arrangement for programming the code setting bonding pads Ip1–Ipn. As shown, to simplify the arrangement of the bonding pads 20, each of the code setting bonding pads Ip1–Ipn is pulled internally to one of a high logic state, such as in the case of the code setting bonding pad Ipn, or a low logic state, such as in the case of the code setting bonding pad Ip1, with the use of a logic pulling unit that includes a resistor R shunted to the VDD or VSS level (only the code setting bonding pads Ip1, Ipn are shown in FIG. 4 for the sake of brevity). The code setting bonding pad Ip1 is formed adjacent to the VDD pad such that, during the bonding stage of the manufacturing process of the integrated circuit 1, a programmed high logic state of the code setting bonding pad Ip1 is achieved by connecting the latter to the VDD pad via wire-bonding at a common lead pad 32 on the lead frame 30 (see FIG. 1), whereas a programmed low logic state of the code setting bonding pad Ip1 is achieved by maintaining the latter in an unconnected state relative to the VDD pad. On the other hand, the code setting bonding pad Ipn is formed adjacent to the VSS pad such that, during the bonding stage of the manufacturing process of the integrated circuit 1, a programmed low logic state of the code setting bonding pad Ipn is achieved by connecting the latter to the VSS pad via wire-bonding at a common lead pad 32 on the lead frame 30 (see FIG. 1), whereas a programmed high logic state of the code setting bonding pad Ipn is achieved by maintaining the latter in an unconnected state relative to the VSS pad. Therefore, unlike the embodiment of FIG. 3, each of the code setting bonding pads Ip1–Ipn of this embodiment need only be formed adjacent to one of the high potential and low potential bonding pads having a logic state that is opposite to the pulled state of the adjacent one of the code setting bonding pads Ip1–Ipn to permit programming of the code setting bonding pads Ip1–Ipn according to the specific configuration of a bonding requirement assigned to a specific customer.

Figure 5:
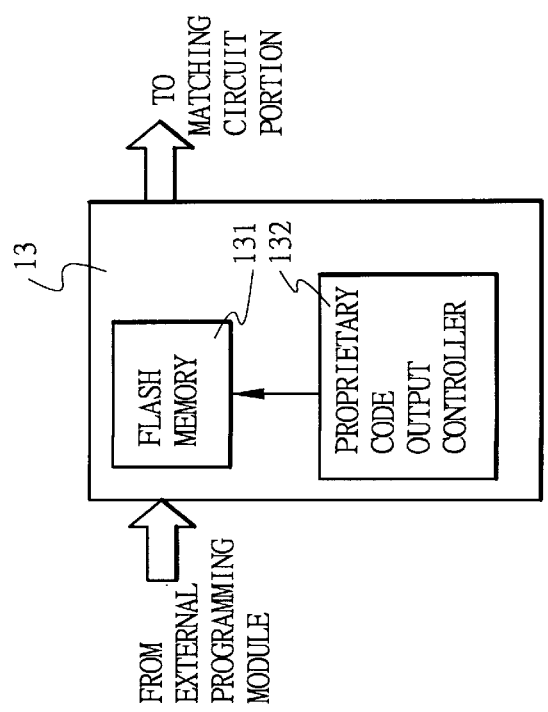
FIG. 5 is a block diagram illustrating how one embodiment of a proprietary code provider portion of the integrated circuit core is set by the customer to provide a proprietary code.

Referring again to FIG. 2, the proprietary code provider portion 13 is adapted to be set by the customer via the application bonding pads for providing a proprietary code. In this embodiment, the proprietary code provider portion 13 provides a proprietary code sequence corresponding to the preset code sequence from the code generating circuit portion 12. As shown in FIG. 5, the proprietary code provider portion 13 can include a non-volatile memory 131, such as a flash memory, and a proprietary code output controller 132 connected to the memory 131. The memory 131 provides a space that is to be programmed with the proprietary code sequence by the customer externally of the integrated circuit 1, such as with the use of an external programming module. The output controller 132 controls the output of the proprietary code sequence from the memory 131 during the certification process for the accessible resource decoder 110, the clock generator 111, the power management module 112 and the embedded microprocessor 113 of the application core circuit portion 11. Once programmed, the proprietary code sequence can be permanently contained in the memory 131. Aside from a flash memory, other type of non-volatile memories, such as EPROM and EEPROM, may be used.

Figure 6:
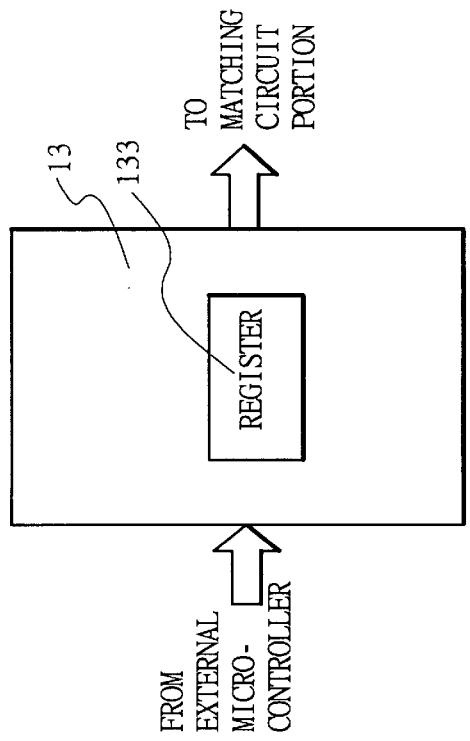
FIG. 6 is a block diagram illustrating how another embodiment of a proprietary code provider portion of the integrated circuit core is set by the customer to provide a proprietary code.

FIG. 6 shows another preferred implementation of the proprietary code provider portion 13. As shown, the proprietary code provider portion 13 of this embodiment includes a register 133 for storing the proprietary code sequence from the customer during a certification process of the integrated circuit 1. In this embodiment, the register 133 receives the proprietary code sequence from an external micro-controller during the certification process. Thus, the proprietary code and the certification process reside in the associated program of the external micro-controller.

Referring once more to FIG. 2, the matching circuit portion 14 receives the preset code sequence and the proprietary code sequence from the code generating circuit portion 12 and the proprietary code provider portion 13, and asserts the accessible resource decoder 110, the clock generator 111, the power management module 112 and the embedded microprocessor 113 of the application core circuit portion 11 when the proprietary code sequence matches the preset code sequence. In this embodiment, the matching circuit portion 14 includes four matching units 140, each of which has an output connected to a respective one of the accessible resource decoder 110, the clock generator 111, the power management module 112 and the embedded microprocessor 113 of the application core circuit portion 11 for asserting the same. Each of the matching units 140 further has a first input connected to the code generating circuit portion 12 to receive the preset code sequence therefrom, and a second input that receives the proprietary code sequence from the proprietary code provider portion 13 via a demultiplexer 142.

In use, when an unscrupulous customer purchases an integrated circuit 1 of the present invention with the intent of using the same in a design that was copied from another customer of the integrated circuit vendor or manufacturer, the copied design will not work because of differences in the bonding configuration at the inputs of the code generating circuit portion 12 of the integrated circuit 1, thereby protecting the designs of customers from piracy. Moreover, since the process for fabricating different customer-configured integrated circuits of the same functional type is kept essentially the same, except for the bonding stage, in order to provide different customers with exclusive use protection, the integrated circuit vendors and manufacturers reap the benefit of little added overhead due to almost unaltered production management.

In the embodiment of FIG. 2, the accessible resource decoder 110, the clock generator 111, the power management module 112 and the embedded microprocessor 113 of the application core circuit portion 11 are asserted by the matching circuit portion 14 when the proprietary code sequence matches the preset code sequence. However, it should be noted that the present invention is still viable even if the matching circuit portion 14 was designed to assert only one of these four devices. In addition, depending on the organization of the application core circuit portion 11, the matching circuit portion 14 may be modified to assert other devices of the application core circuit portion 11 as well. Such modifications can be readily realized by a skilled artisan and will not be described further.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A method for fabricating a customer-configured integrated circuit for exclusive use by a customer, comprising:

forming an integrated circuit core during a chip fabrication stage, the integrated circuit core having an application core circuit portion, a code generating circuit portion for generating a customer-specific code assigned to the integrated circuit, a proprietary code provider portion adapted to be set by the customer for providing a proprietary code, and a matching circuit portion having inputs connected to the code generating circuit portion and the proprietary code provider portion to receive the customer-specific code and the proprietary code therefrom, and an output connected to the application core circuit portion for asserting the application core circuit portion upon detection of a match between the customer-specific code and the proprietary code;

providing a plurality of application bonding pads and code setting bonding pads on the integrated circuit core, the application bonding pads being connected to the application core circuit portion and the proprietary code provider portion during a pad bonding stage, the code setting bonding pads being connected to the code generating circuit portion during the pad bonding stage; and programming the code setting bonding pads during the pad bonding stage by selectively bonding each of the code setting bonding pads to a reference potential to enable the code generating circuit portion to generate the customer-specific code assigned to the integrated circuit.

2. The method of claim 1, wherein the application bonding pads include high potential and low potential bonding pads, each of the code setting bonding pads being formed between an adjacent pair of the high potential and low potential bonding pads.

3. The method of claim 2, wherein the step of programming the code setting bonding pads includes connecting each of the code setting bonding pads to an appropriate one of the high potential and low potential bonding pads in the adjacent pair.

4. The method of claim 3, further comprising mounting the integrated circuit core on a lead frame having lead pads, and wire bonding the application bonding pads and the code setting bonding pads to the lead pads on the lead frame.

5. The method of claim 1, further comprising forming the integrated circuit core with logic pulling means for pulling each of the code setting bonding pads to one of a high logic state and a low logic state.

6. The method of claim 5, wherein the application bonding pads include high potential and low potential bonding pads, each of the code setting bonding pads being pulled to a logic state that is opposite to an adjacent one of the high potential and low potential bonding pads.

7. The method of claim 6, wherein the step of programming the code setting bonding pads includes selectively connecting each of the code setting bonding pads to the adjacent one of the high potential and low potential bonding pads to enable the code generating circuit portion to generate the customer-specific code assigned to the integrated circuit.

8. The method of claim 7, further comprising mounting the integrated circuit core on a lead frame having lead pads, and wire bonding the application bonding pads and appropriate ones of the code setting bonding pads to the lead pads on the lead frame.

9. The method of claim 1, wherein the proprietary code provider portion includes a non-volatile memory adapted to be programmed with the proprietary code by the customer externally of the integrated circuit, and an output controller connected to the non-volatile memory and operable so as to enable the non-volatile memory to provide the proprietary code to the matching circuit portion.

10. The method of claim 1, wherein the proprietary code provider portion includes a register adapted to store the proprietary code from the customer.

11. A customer-configured integrated circuit for exclusive use by a customer, comprising:

an integrated circuit core formed during a chip fabrication stage, the integrated circuit core having an application core circuit portion, a code generating circuit portion for generating a customer-specific code assigned to the integrated circuit, a proprietary code provider portion adapted to be set by the customer for providing a proprietary code, and a matching circuit portion having inputs connected to said code generating circuit portion and said proprietary code provider portion to receive the customer-specific code and the proprietary code therefrom, and an output connected to said application core circuit portion, said matching circuit portion asserting said application core circuit portion upon detection of a match between the customer-specific code and the proprietary code; and a plurality of application bonding pads and code setting bonding pads provided on said integrated circuit core, said application bonding pads being connected to said application core circuit portion and said proprietary code provider portion during a pad bonding stage, said code setting bonding pads being connected to said code generating circuit portion during said pad bonding stage, said code setting bonding pads being programmed during said pad bonding stage by selectively bonding each of said code setting bonding pads to a reference potential to enable said code generating circuit portion to generate the customer-specific code assigned to the integrated circuit.

12. The customer-configured integrated circuit of claim 11, wherein said application bonding pads include high potential and low potential bonding pads, each of said code setting bonding pads being formed between an adjacent pair of said high potential and low potential bonding pads.

13. The customer-configured integrated circuit of claim 12, wherein each of said code setting bonding pads is connected to an appropriate one of said high potential and low potential bonding pads in the adjacent pair.

14. The customer-configured integrated circuit of claim 13, further comprising a lead frame with lead pads, said integrated circuit core being mounted on said lead frame, said application bonding pads and said code setting bonding pads being wire bonded to said lead pads on said lead frame.

15. The customer-configured integrated circuit of claim 11, wherein said integrated circuit core is further formed with logic pulling means for pulling each of said code setting bonding pads to one of a high logic state and a low logic state.

16. The customer-configured integrated circuit of claim 15, wherein said application bonding pads include high potential and low potential bonding pads, each of said code setting bonding pads being pulled to a logic state that is opposite to an adjacent one of said high potential and low potential bonding pads.

17. The customer-configured integrated circuit of claim 16, wherein each of said code setting bonding pads is selectively connected to the adjacent one of said high potential and low potential bonding pads to enable said code generating circuit portion to generate the customer-specific code assigned to the integrated circuit.

18. The customer-configured integrated circuit of claim 17, further comprising a lead frame with lead pads, said integrated circuit core being mounted on said lead frame, said application bonding pads and appropriate ones of said code setting bonding pads being wire bonded to said lead pads on said lead frame.

19. The customer-configured integrated circuit of claim 11, wherein said proprietary code provider portion includes a non-volatile memory adapted to be programmed with the proprietary code by the customer externally of the integrated circuit, and an output controller connected to said non-volatile memory and operable so as to enable said non-volatile memory to provide the proprietary code to said matching circuit portion.

20. The customer-configured integrated circuit of claim 11, wherein said proprietary code provider portion includes a register adapted to store the proprietary code from the customer.

* * * * *

UNITED STATES PATENT AND TRADEMARK OFFICE
CERTIFICATE OF CORRECTION

PATENT NO. : 6,175,951 B1
DATED : January 16, 2001
INVENTOR(S) : R.-F. Shyu

It is certified that error appears in the above-identified patent and that said Letters Patent is hereby corrected as shown below:

<u>Title page,</u>
Item [54], Title "METHOD FOR FABRICATING A CUSTOMER-CONFIGURED INTEGRATED CIRCUIT AND CUSTOMER-CONFIGURED INTEGRATED CIRCUIT FOR EXCLUSIVE USE BY A CUSTOMER BACKGROUND OF THE INVENTION" should read -- METHOD FOR FABRICATING A CUSTOMER-CONFIGURED INTEGRATED CIRCUIT, AND CUSTOMER-CONFIGURED INTEGRATED CIRCUIT FOR EXCLUSIVE USE BY A CUSTOMER --

Item [74], Attorney, Agent or Firm, "Kindness," should read -- Kindness --

<u>Column 1,</u>
Lines 1-6, "METHOD FOR FABRICATING A CUSTOMER-CONFIGURED INTEGRATED CIRCUIT AND CUSTOMER-CONFIGURED INTEGRATED CIRCUIT FOR EXCLUSIVE USE BY A CUSTOMER BACKGROUND OF THE INVENTION" should read -- METHOD FOR FABRICATING A CUSTOMER-CONFIGURED INTEGRATED CIRCUIT, AND CUSTOMER-CONFIGURED INTEGRATED CIRCUIT FOR EXCLUSIVE USE BY A CUSTOMER --

Signed and Sealed this

Second Day of April, 2002

*Attest:*

JAMES E. ROGAN
*Attesting Officer*   *Director of the United States Patent and Trademark Office*